United States Patent [19]
Van Auken et al.

[11] Patent Number: 5,831,562
[45] Date of Patent: Nov. 3, 1998

[54] DIFFERENTIAL SAMPLE AND HOLD CIRCUIT WITH COMMON MODE SAMPLING FOR AN ANALOG-TO-DIGITAL CONVERTER

[75] Inventors: Jeffrey B. Van Auken, Littleton; Joseph L. Sousa, Lawrence, both of Mass.

[73] Assignee: Sipex Corporation, Billerica, Mass.

[21] Appl. No.: 678,976

[22] Filed: Jul. 12, 1996

[51] Int. Cl.⁶ ............................................. H03M 1/38
[52] U.S. Cl. .......................... 341/122; 341/162; 327/94
[58] Field of Search ................................ 341/122, 143, 341/161, 162, 163, 172; 327/94, 96

[56] References Cited

U.S. PATENT DOCUMENTS

| | | | |
|---|---|---|---|
| 4,896,156 | 1/1990 | Garverick | 341/172 |
| 5,581,252 | 12/1996 | Thomas | 341/172 |
| 5,617,093 | 4/1997 | Klein | 341/172 |
| 5,638,020 | 6/1997 | Koifman et al. | 327/94 |
| 5,638,072 | 6/1997 | Van Auken et al. | 341/172 |

FOREIGN PATENT DOCUMENTS

| 6-164399 | 6/1994 | Japan | 341/161 |
|---|---|---|---|

OTHER PUBLICATIONS

Burr–Brown, "Speedplus™ 12–Bit, 40MHz Sampling Analog–to–Digital Converter", 3 pages, (Dec. 1995).

*Primary Examiner*—Howard L. Williams
*Attorney, Agent, or Firm*—Testa, Hurwitz & Thibeault, LLP

[57] ABSTRACT

A full differential sample and hold circuit for an analog to digital converter. The sample and hold circuit samples and holds the differential signal resulting from two input signals. The sample and hold circuit includes a comparator, two differential capacitors and a common mode sample and hold circuit. The comparator has two input terminals and an output terminal. Each of the differential capacitors corresponds to one of the input signals and has an input terminal adapted for selective coupling to the respective input signal. Each of the differential capacitors has an output terminal electrically coupled to a different input terminal of the comparator. The common mode sample and hold circuit is disposed between the input terminals of the two differential capacitors. In one embodiment, the common mode sample and hold circuit comprises two common mode capacitors. Each of the common mode capacitors has an output terminal electrically coupled to a reference voltage and an input terminal electrically coupled to the input terminal of a different differential capacitor. In another embodiment, the reference voltage is ground. The invention also relates to a method of sampling and holding a differential signal.

8 Claims, 10 Drawing Sheets

| FIG. 7A | FIG. 7C |
|---|---|
| FIG. 7B | |

5,831,562

DIFFERENTIAL SAMPLE AND HOLD CIRCUIT WITH COMMON MODE SAMPLING FOR AN ANALOG-TO-DIGITAL CONVERTER

FIELD OF THE INVENTION

The invention relates generally to sample and hold circuits and more specifically to a full differential sample and hold circuit for an analog to digital converter.

BACKGROUND OF THE INVENTION

An analog to digital converter converts an analog signal into a corresponding digital signal. Analog to digital converters which iteratively increment or decrement a sampled analog input signal to determine its value are known to one skilled in the art of data sampling. In such a converter, an analog signal applied to one input of the converter is converted to a digital signal at the output of the converter. Generally, an analog input signal is sampled by a sample and hold circuit. In many applications it is desirable to convert a differential analog signal resulting from two dynamic input signals into a single corresponding digital signal. In such applications, a fully differential dynamic signal must be converted into a single ended signal prior to a single ended analog to digital converter digitizing the signal. In such differential converters, generally a pseudo differential sample and hold circuit or a full differential sample and hold circuit samples and holds the differential signal until the converter converts the analog signal to a digital signal.

In more detail, an example of such a pseudo differential sample and hold circuit 10 known to the prior art is shown as a block diagram in FIG. 1A. The sample and hold circuit 10 includes two capacitors 11, 12, an operational amplifier 13 and a number of switches. The operational amplifier 13 has two input terminals, 14, 15 and one output terminal 16. The first capacitor 11 has a first terminal 17 which is electrically coupled to an analog input signal $V_{INA}$ and a second terminal 18 which is electrically coupled to the positive input terminal 14 of the operational amplifier 13. The second capacitor 12 has a first terminal 19 which is adapted for selective coupling to an analog input signal $V_{INB}$ or to the analog input signal $V_{INA}$ and a second terminal 20 which is electrically coupled to the negative input terminal 15 of the operational amplifier 13. An input coupling switch 23 is disposed between the first terminal 19 of the second capacitor 12 and two input signal ports 21, 22. The input coupling switch 23 has a first sampling position A in which the first input signal port 21 is electrically coupled to the first terminal 19 of the second capacitor 12, and a second hold/convert position B in which the second input signal port 22 is electrically coupled to the first terminal 19 of the second capacitor 12.

In more detail, during the sampling mode, each of the capacitors 11, 12 is electrically coupled to one of the analog input signals $V_{INA}$, $V_{INB}$. More specifically, the first terminal 17 of the first capacitor 11 is electrically coupled to the second input signal port 22 and the first terminal 19 of the second capacitor 12 is electrically coupled to the first input signal port 21 through the input coupling switch 23. Also, during the sampling mode, the switch 23' is closed such that the positive input terminal 14 and the negative input terminal 15 of the operational amplifier 13 are electrically coupled to a reference voltage CMPCM. During the hold mode, first the switch 23' is opened thereby disconnecting the input terminals 14, 15 of the operational amplifier 13 from the reference voltage CMPCM. Next, the input coupling switch 23 transitions from the sampling position A to the hold/convert position B, thereby electrically coupling the first terminal 19 of the second capacitor 12 to the second input signal port 22.

The known pseudo differential sample and hold circuit 10 shown in FIG. 1A has common mode problems. If the input signal $V_{INA}$ does not remain constant during the sample, hold and conversion modes, both the common mode and differential components of the input signals $V_{INA}$, $V_{INB}$ will be present at the comparator inputs 14, 15 during the conversion mode rather than just the differential component. The common mode component of the input signals $V_{INA}$, $V_{INB}$ is the average of the two input signals $V_{INA}$, $V_{INB}$. The common mode component of the input signal is impressed on the comparator inputs 14, 15 because the pseudo differential sample and hold circuit 10 does not hold $V_{INA}$, the negative side of the input signal, constant during the conversion mode. The common mode component must remain constant throughout the entire conversion period in order to prevent a common mode voltage being impressed on the comparator inputs 14, 15. Thus, the pseudo differential sample and hold circuit 10 requires external circuitry to hold the common mode portion of the signal to ensure that only the differential component of the input signals $V_{INA}$, $V_{INB}$ is impressed on the comparator inputs 14, 15. If the pseudo differential sample and hold circuit 10 does not have external circuitry to hold the common mode component, $V_{INA}$ cannot be a dynamic signal, but rather must be a direct current (DC) signal to avoid a common mode voltage from being impressed on the comparator inputs 14, 15.

An example of a full differential sample and hold circuit 24 known to the prior art is shown as a block diagram in FIG. 1B. The full differential sample and hold circuit 24 includes two input capacitors 25, 26, two feedback capacitors 27, 28, an operational amplifier 29 and a number of switches. The operational amplifier 29 has two input terminals 30, 31 and two output terminals 32, 33. The first input capacitor 25 has a first terminal 34 which is adapted for selective coupling to an analog input signal $V_{INA}$ and a second terminal 35 which is electrically coupled to the positive input terminal 30 of the operational amplifier 29. The second input capacitor 26 has a first terminal 36 which is adapted for selective coupling to an analog input signal $V_{INB}$ and a second terminal 37 which is electrically coupled to the negative input terminal 31 of the operational amplifier 29. The first feedback capacitor 27 has a first terminal 38 electrically coupled to the positive input terminal 30 of the operational amplifier 29 and a second terminal 40 which is adapted for selective coupling to the first output terminal 32 of the operational amplifier 29. The second feedback capacitor 28 has a first terminal 42 which is electrically coupled to the negative input terminal 31 of the operational amplifier 29 and a second terminal 44 which is adapted for selective coupling to the second output terminal 33 of the operational amplifier 29.

The switches 46, 48, 50, 52, 54, 56, 58, 60 and 62 are controlled by an internal clock which has a non-overlapping two phase signal. During the first clock phase or sample mode, switches 46, 50, 52, 54, 58, and 60 are closed and switches 48, 56 and 62 are open. During the second clock phase or hold mode, switches 48, 56 and 62 are closed and switches 46, 50, 52, 54, 58 and 60 are open.

In more detail, during the sampling mode, each of the input capacitors 25, 26 is electrically coupled to one of the analog input signals $V_{INA}$, $V_{INB}$. More specifically, each of the input capacitors' first terminals 34, 36 is electrically coupled to a respective input signal port 64, 66 through switch 46. Also, during sampling mode, the positive input terminal 30 and the negative input terminal 31 of the operational amplifier 29 are electrically shorted through switch 50. During the hold mode, the first terminals 34, 36 of the input capacitors 25, 26 respectively, are electrically coupled through switch 48 and the second terminals 40, 44 of the feedback capacitors 27, 28 are electrically coupled to the output terminals 32, 33 of the operational amplifier 29 through switches 56 and 62 respectively.

The full differential sample and hold circuit 24 converts the analog differential signal resulting from the two analog input signals $V_{INA}$, $V_{INB}$ into a differential analog output between $V_{OUTA\ and\ VOUTB}$. The differential output of the full differential sample and hold circuit 24 is a held DC representation of the differential analog input signal at the time the differential input signal is sampled. Note that an analog to digital converter utilizing the full differential sample and hold circuit 24 would require an additional amplifier to convert the differential analog output signal into a single ended signal prior to conversion into a corresponding digital signal.

In general, known full differential sample and hold circuits, such as the sample and hold circuit 24 shown in FIG. 1B, have common mode problems. That is, the known circuits have feedthrough problems during the conversion mode. Any change in the common mode component of the input signal during the conversion mode can feed through the switch 46 and be impressed on the operational amplifier inputs 30, 31 because the circuitry composing the switch 46 only behaves as an open circuit to DC signals and not to alternating current (AC) signals. The known circuits therefore require an operational amplifier that operates throughout a significant common mode range of the input signals $V_{INA}$, $V_{INB}$ because these circuits do not have the ability to hold changes in the common mode component externally from the operational amplifier inputs 30, 31. If the common mode component is not held externally from the operational amplifier inputs 30, 31, it will be impressed on the inputs 30, 31.

Also, an analog to digital converter utilizing the full differential sample and hold circuit 24 will not operate properly at all times if the common mode component of the input signal is allowed to move along the entire dynamic range of zero volts to the positive supply voltage. For example, the operation of the analog to digital converter will not be valid during intervals in which the input signal has a large common mode component which is close to the positive supply voltage VDA and a small differential component because the operation of the operational amplifier 29 is no longer valid when the voltage across the input terminals 30, 31 is close to the positive supply voltage VDA. Referring briefly to FIG. 4, the current source 172 supplying current to the operational amplifier 29 must supply a constant current for the operational amplifier 29 to operate properly. As the voltage across the operational amplifier inputs 30, 31 approaches the positive supply voltage VDA, the operational amplifier 29 no longer has compliance and operates improperly because the current source 172 no longer supplies a constant current. One known solution to the problem maintaining a constant current supply is to charge pump the operational amplifier 29. Charge pumping however requires additional circuitry which further complicates the operational amplifier 29 design.

What is desired then is a full differential sample and hold circuit for an analog to digital converter which accurately samples and holds a full differential signal without the common mode and operational amplifier design problems of known circuits. The present invention permits such functionality.

SUMMARY OF THE INVENTION

The invention relates to a full differential sample and hold circuit for an analog to digital converter. The sample and hold circuit samples and holds the differential signal resulting from two analog input signals. In one embodiment, both of the input signals are dynamic. The sample and hold circuit includes a comparator, two differential capacitors and a common mode sample and hold circuit. The comparator has two input terminals and an output terminal. Each of the differential capacitors corresponds to one of the input signals and has an input terminal adapted for selective coupling to the respective input signal. Each of the differential capacitors has an output terminal electrically coupled to a different input terminal of the comparator. The common mode sample and hold circuit is disposed between the input terminals of the two differential capacitors. In one embodiment, the common mode sample and hold circuit comprises two common mode capacitors. Each of the common mode capacitors has an output terminal electrically coupled to a reference voltage and an input terminal electrically coupled to the input terminal of a different differential capacitor. In another embodiment, the reference voltage is ground.

The invention also relates to a method of sampling and holding a differential signal for an analog to digital converter. The method includes a sampling step, a holding step and a converting step. The sampling step of the method includes the steps of electrically coupling a first input signal to a first input terminal of a comparator through a first differential capacitor, electrically coupling a second input signal to a second input terminal of the comparator through a second differential capacitor, electrically coupling a sample and hold circuit between the input terminals of the two differential capacitors, and applying a reference voltage across the two comparator input terminals. After sampling the differential signal, the sample and hold circuit enters the holding step. During the holding step, the reference voltage being applied across the two comparator input terminals is removed and the charge on the two differential capacitors is a function of the difference between the two input signals. Next, the two input signals are removed from the input terminals of the differential capacitors. Finally, during the converting step, the input terminals of the two differential capacitors are electrically coupled together.

The present invention has the technical advantage of accurately sampling and holding a full differential signal. The present invention has the further advantage that the operational amplifier utilized as the comparator in the sample and hold circuit need not be designed to operate over the full input signal common mode range. The present invention has yet the further advantage of accurately sampling and holding a full differential signal resulting from two dynamic input signals.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

Like reference characters in the respective drawn figures indicate corresponding parts.

DETAILED DESCRIPTION OF THE INVENTION

Figure 1A:
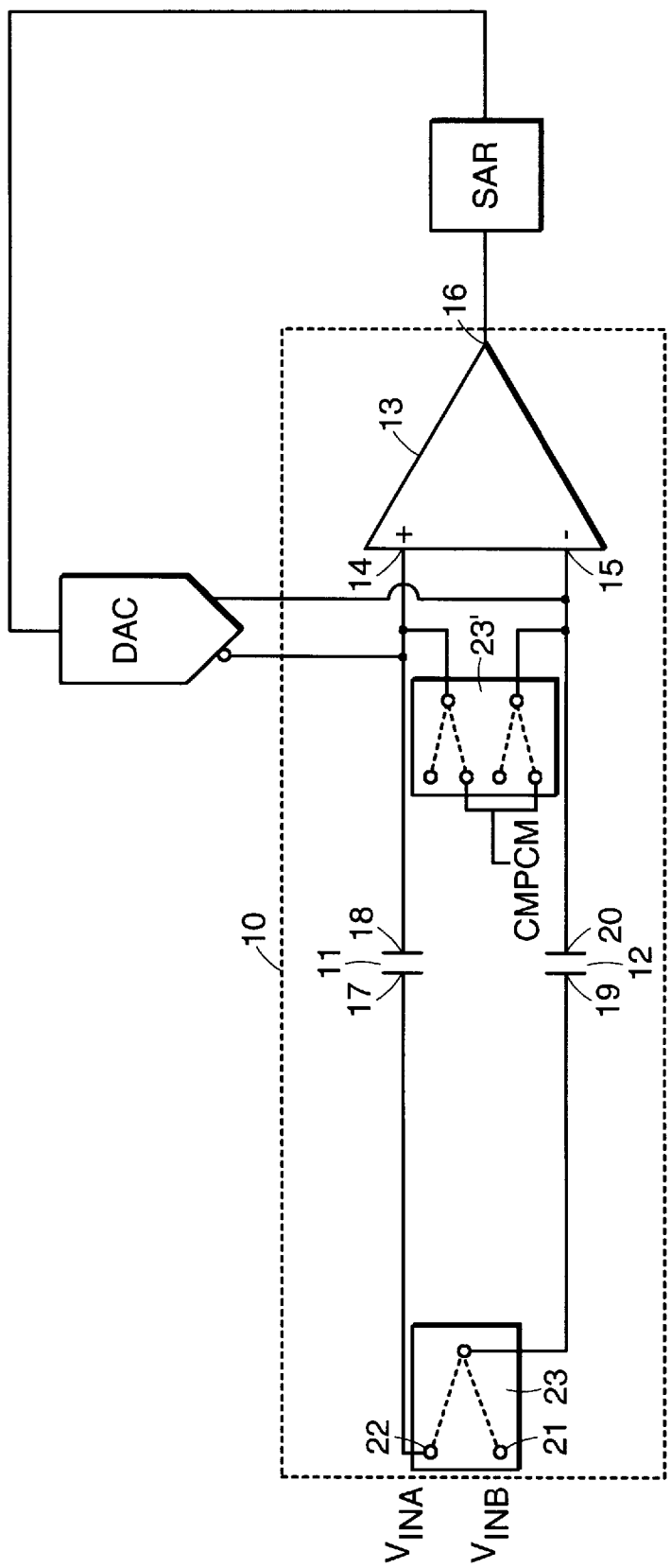
FIG. 1A is a block diagram of a pseudo differential sample and hold circuit known to the prior art.
Figure 1B:
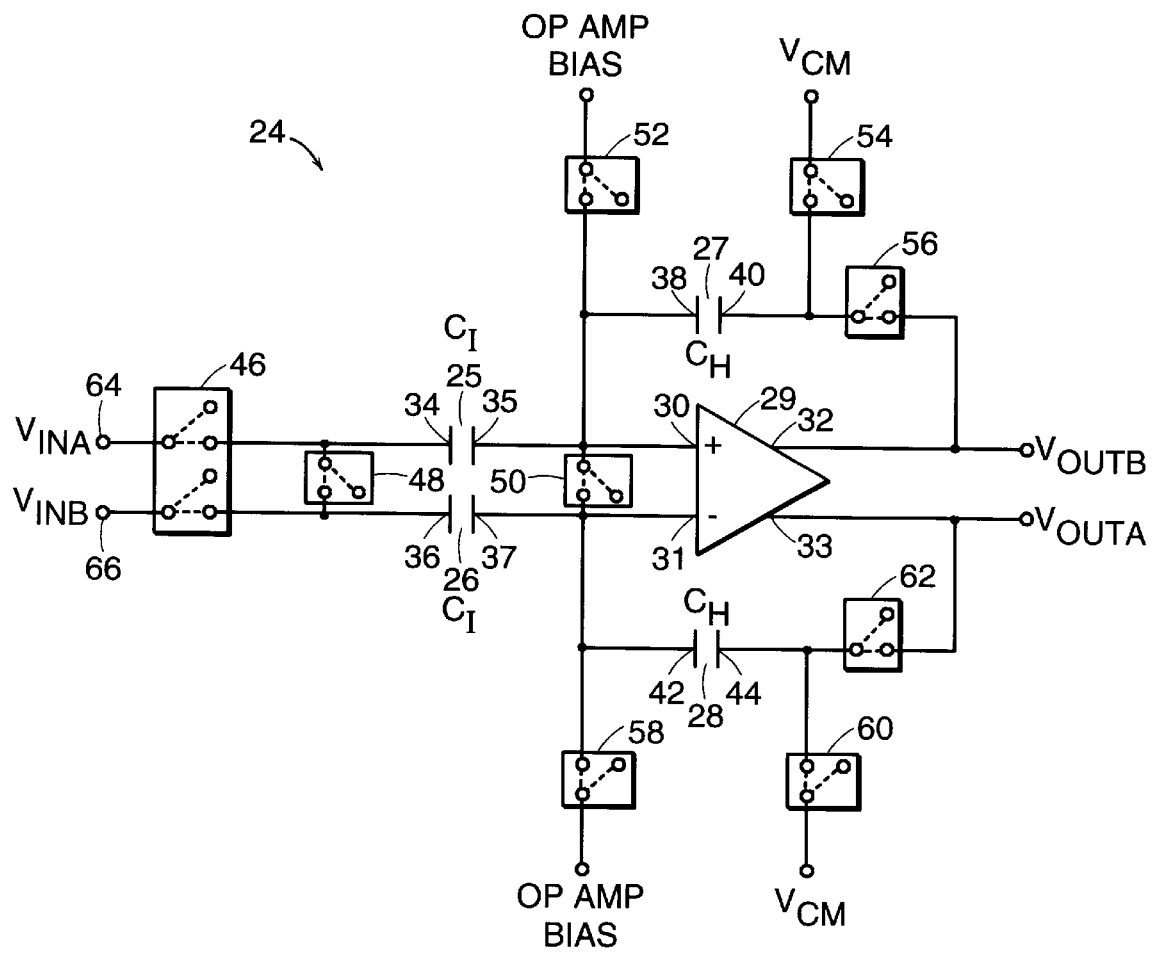
FIG. 1B is a block diagram of a full differential sample and hold circuit known to the prior art.
Figure 2:
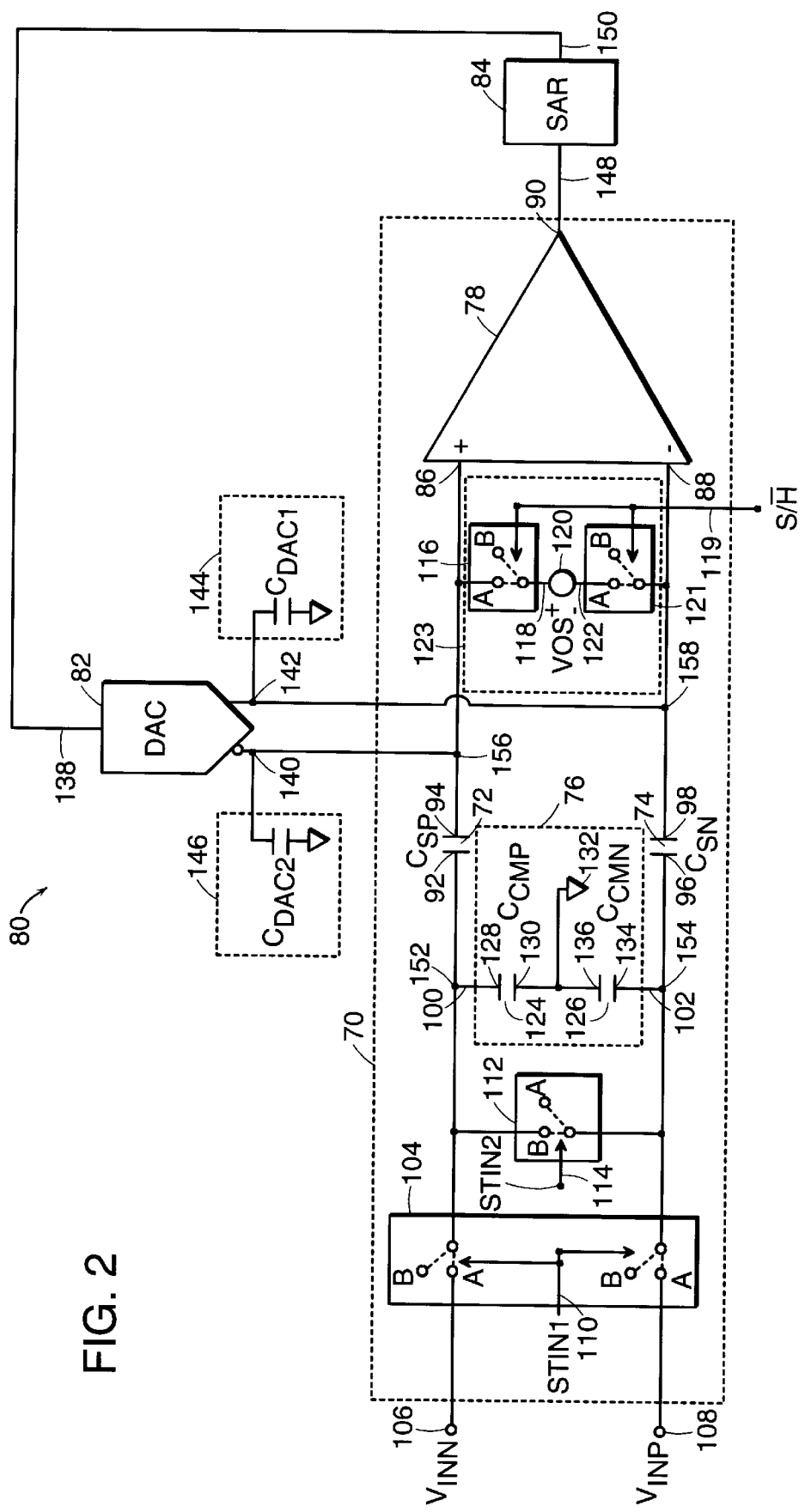
FIG. 2 is a block diagram of an embodiment of a full differential sample and hold circuit in accordance with the present invention.

Referring to FIG. 2 and in brief overview, an embodiment of a full differential sample and hold circuit 70 constructed in accordance with the invention includes two differential capacitors 72, 74, a common mode sample and hold circuit 76, a comparator 78 and a plurality of switches. In the embodiment shown in FIG. 2, the sample and hold circuit 70 is part of an analog to digital converter 80 which further includes a digital to analog converter (DAC) 82 and a successive approximation register (SAR) 84. The sample and hold circuit 70 samples the differential signal resulting from the two input signals $V_{INP \ and \ VINN}$. The analog to digital converter 80 converts the sampled differential signal into a corresponding digital signal. The analog to digital converter 80 will be discussed in more detail below.

The comparator 78 has a positive input terminal 86, a negative input terminal 88 and an output terminal 90. The first differential capacitor $C_{SP}$ 72 has an input terminal 92 which is adapted for selective coupling to an analog input signal $V_{INN}$ through an input signal port 106 and an output terminal 94 electrically coupled to the positive input terminal 86 of the comparator 78. The second differential capacitor $C_{SN}$ 74 has an input terminal 96 which is adapted for selective coupling to an analog input signal $V_{INP}$ through an input signal port 108 and an output terminal 98 electrically coupled to the negative input terminal 88 of the comparator 78. The purpose of the differential capacitors 72, 74 is to store the differential component of the input signal. In one embodiment, the capacitance of the first differential capacitor $C_{SP}$ 72 is approximately equal to the capacitance of the second differential capacitor $C_{SN}$ 74. In the preferred embodiment, both of the differential capacitors 72, 74 have a capacitance approximately equal to 12.8 pF. The common mode sample and hold circuit 76 has a first terminal 100 electrically coupled to the input terminal 92 of the first differential capacitor $C_{SP}$ 72 and a second terminal 102 electrically coupled to the input terminal 96 of the second differential capacitor $C_{SN}$ 74.

An input coupling switch 104 is disposed between the input terminal 92 of the first differential capacitor $C_{SP}$ 72 and the first input signal port 106 and between the input terminal 96 of the second differential capacitor $C_{SN}$ 74 and the second input signal port 108, as shown. The input coupling switch 104 has a first sampling position A in which the first input signal port 106 is electrically coupled to the input terminal 92 of the first differential capacitor $C_{SP}$ 72 and the second input signal port 108 is electrically coupled to the input terminal 96 of the second differential capacitor $C_{SN}$ 74, and a second open position B in which the input signal ports 106, 108 are disconnected from the input terminals 92, 96 of the differential capacitors 72, 74 respectively, in response to a control signal STIN1 on line 110.

The input terminal 92 of the first differential capacitor $C_{SP}$ 72 is further adapted for selective coupling to the input terminal 96 of the second differential capacitor $C_{SN}$ 74, through a coupling switch 112 disposed between the input terminal 92 of the first differential capacitor $C_{SP}$ 72 and the input terminal 96 of the second differential capacitor $C_{SN}$ 74. The coupling switch 112 has a first, open sampling position A in which the input terminal 92 of the first differential capacitor $C_{SP}$ 72 is not electrically coupled to the input terminal 96 of the second differential capacitor $C_{SN}$ 74 through the coupling switch 112, and a second closed position B in which the input terminal 92 of the first differential capacitor $C_{SP}$ 72 is electrically coupled to the input terminal 96 of the second differential capacitor $C_{SN}$ 74 through the coupling switch 112 in response to a control signal STIN2 on line 114. In one embodiment, the input coupling switch 104 and the coupling switch 112 are the same switch and the control signals STIN1 and STIN2 are the same control signal. The circuitry composing the switches 104 and 112 will be described in more detail below in the discussion of FIGS. 7A, 7B and 7C.

In one embodiment, the comparator 78 further comprises a first switch 116 disposed between the positive input terminal 86 of the comparator 78 and a first terminal 118 of a comparator reference voltage source ($V_{OS}$) 120 and a second switch 121 disposed between the negative input terminal 88 of the comparator 78 and a second terminal 122 of the comparator reference voltage source ($V_{OS}$) 120. This portion 123 of the comparator 78 is shown separately from the comparator 78 for clarity, but is part of the comparator 78 circuitry. The switch 116 has a first sampling position A in which the positive input terminal 86 of the comparator 78 is electrically coupled to the first terminal 118 of the comparator reference voltage source ($V_{OS}$) 120 and a second open position B in which the positive terminal 86 of the comparator 78 is not electrically coupled to the first terminal 118 of the comparator reference voltage source ($V_{OS}$) 120. Similarly, the switch 121 has a first sampling position A in which the negative input terminal 88 of the comparator 78 is electrically coupled to the second terminal 122 of the comparator reference voltage source ($V_{OS}$) 120 and a second open position B in which the negative input terminal 88 of the comparator 78 is not electrically coupled to the second terminal 122 of the comparator reference voltage source ($V_{OS}$) 120. The switches 116 and 121 are controlled by a control signal S/$\overline{H}$ on line 119. In one embodiment, the switches 116 and 121 are the same switch. The comparator 78 will be discussed in more detail below.

In one embodiment, the common mode sample and hold circuit 76 further comprises two common mode capacitors 124, 126. The purpose of the two common mode capacitors 124, 126 is to store the common mode component of the input signal. The first common mode capacitor $C_{CMP}$ 124 has an input terminal 128 electrically coupled to the input terminal 92 of the first differential capacitor $C_{SP}$ 72 and an output terminal 130 electrically coupled to a reference voltage 132. The second common mode capacitor $C_{CMN}$ 126 has an input terminal 134 electrically coupled to the input terminal 96 of the second differential capacitor $C_{SN}$ 74 and an output terminal 136 electrically coupled to the reference voltage 132. In one embodiment, the capacitance of the first common mode capacitor $C_{CMP}$ 124 is approximately equal to the capacitance of the second common mode capacitor $C_{CMN}$ 126. In the preferred embodiment, both common mode capacitors 124, 126 have a capacitance approximately equal to 5 pF. In another embodiment, the reference voltage 132 is ground.

Figure 3:
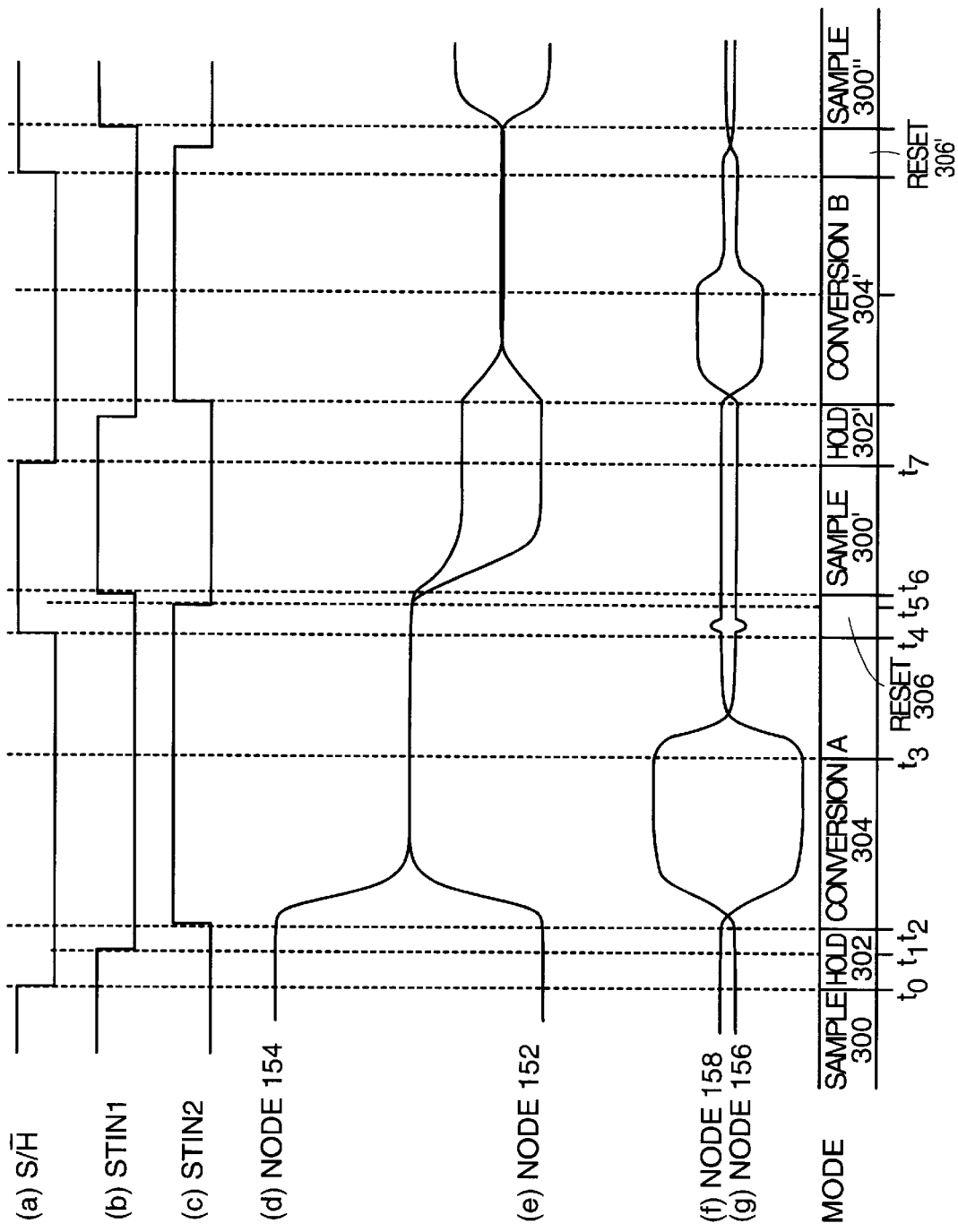
FIG. 3 is a timing diagram of control signals associated with the embodiment of the sample and hold circuit shown in FIG. 2 and is a series of waveforms produced during each mode of operation of the embodiment of the sample and hold circuit shown in FIG. 2.

The full differential sample and hold circuit 70 has three different modes of operation: sample mode, hold mode and convert mode. Referring to FIG. 3, waveform (a) depicts the control signal S/$\overline{H}$ which controls the operation of switches 116 and 121. When the control signal S/$\overline{H}$ is high or asserted, the switches 116 and 121 are closed and when the control signal S/$\overline{H}$ is low or unasserted, the switches 116 and 121 are open. Waveform (b) depicts the control signal STIN1 which controls the input coupling switch 104. When the control signal STIN1 is high or asserted, the switch 104 is closed and when the control signal STIN1 is low or unasserted, the switch 104 is open. Waveform (c) depicts the control signal STIN2 which controls the switch 112. When the control signal STIN2 is high or asserted, the switch 112 is closed and when the control signal STIN2 is low or unasserted, the switch 112 is open. Waveforms (d), (e), (f) and (g) represent the voltages on nodes 154, 152 at the terminals of the common mode sample and hold circuit 76 (102, 100), and nodes 158 and 156 at the output terminals 142, 140 of the DAC 82, respectively, of the full differential sample and hold circuit 70 shown in FIG. 2 during the three modes of operation.

During the sample modes 300, 300', the full differential sample and hold circuit 70 acquires the differential input voltage resulting from the analog input signals $V_{INP}$ and $V_{INN}$. During the sampling modes 300, 300', the control signal S/$\overline{H}$ is high or asserted, the control signal STIN1 is high or asserted and the control signal STIN2 is low or unasserted. Throughout the sampling modes 300, 300', the control signals STIN1, STIN2, and S/$\overline{H}$ hold switches 104, 112, 116 and 121 in the first sampling position A. As described above, in position A, the switch 104 is closed and electrically couples the input terminal 92 of the first differential capacitor $C_{SP}$ 72 to the first input signal port 106 and the input terminal 96 of the second differential capacitor $C_{SN}$ 74 to the second input signal port 108. Also, in sampling position A, the coupling switch 112 is open. Finally, in sampling position A, the switch 116 is closed and electrically couples the positive input terminal 86 of the comparator 78 to the first terminal 118 of the comparator reference voltage source ($V_{OS}$) 120 and the switch 121 is closed and electrically couples the negative input terminal 88 of the comparator 78 to the second terminal 122 of the comparator reference voltage source ($V_{OS}$) 120 such that voltage $V_{OS}$ is applied across the comparator input terminals 86, 88. Offset voltage $V_{OS}$ defines the operating point of the comparator input stage. $V_{OS}$ does not vary with $V_{INP}$ or $V_{INN}$. At the end of the first sample mode 300, represented in FIG. 3 as time $t_\emptyset$, $V_{INN1}$ appears at node 152 and $V_{INP1}$ appears at node 154. $V_{INN1}$ and $V_{INP1}$ represent the voltages of the input signals $V_{INN}$ and $V_{INP}$ at the time the input signals $V_{INN}$ and $V_{INP}$ were sampled. Also, at the end of the sample mode 300 $t_{527}$, the voltage at node 156 ($V_{156}$) is equal to the comparator operating voltage $V_{CCM}$ plus one-half of the comparator offset voltage $V_{OS}$ as described by equation (1) below and the voltage at node 158 ($V_{158}$) is equal to the comparator operating voltage $V_{CCM}$ minus one-half of the comparator offset voltage $V_{OS}$ as described by equation (2) below.

$$V_{156} = \left( V_{CCM} + \frac{V_{OS}}{2} \right) \tag{1}$$

$$V_{158} = \left( V_{CCM} - \frac{V_{OS}}{2} \right) \tag{2}$$

The second mode is the hold mode which is represented by hold intervals 302 and 302' in FIG. 3. The sample and hold circuit 70 holds the signals $V_{INP1}$ and $V_{INN1}$ by simultaneously opening switches 116 and 121 at time to and then opening switch 104 at time $t_1$. In more detail, to initiate the hold mode, at time $_\emptyset$ the control signal S/$\overline{H}$ first switches to low and simultaneously toggles switches 116 and 121 toward the open position B in which neither the positive input terminal 86 nor the negative input terminal 88 of the comparator 78 is electrically coupled to the comparator reference voltage source ($V_{OS}$) 120. During the hold mode, the charge on the differential capacitors 72, 74 and the common mode capacitors 124, 126 is a linear function of ($V_{INP1}-V_{INN1}$). Assuming close to infinite impedance at the comparator inputs 86, 88 and DAC 82, once the switches 116 and 121 are opened, the charge on the differential capacitors 72, 74 is fixed and the capacitors 72, 74 can no longer be charged. The charge on the differential capacitors 72,74 remains constant even though $V_{INP \text{ and } VINN}$ may change. Because the impedance at the comparator inputs 86, 88 and DAC 82 is not infinite, during the conversion mode, represented in FIG. 3 by conversion intervals 304, 304', there may be a small amount of leakage current. The sample and hold circuit 70 will accurately hold the differential signal as long as the leakage current at the comparator inputs 86, 88 and DAC 82 outputs 140, 142 is small relative to the capacitance of the differential capacitors $C_{SP}$ 72, $C_{SN}$ 74, and DAC capacitors $C_{DAC1}$ 144, $C_{DAC2}$ 146. If the leakage current at the comparator inputs 86, 88 is small relative the capacitance of $C_{SP}$ 72, $C_{SN}$ 74, $C_{DAC1}$ 144 and $C_{DAC2}$ 146, the change in voltage at the comparator inputs 86, 88 will be small, resulting in an accurate conversion of the sampled differential signal.

Next, at time $t_1$ the control signal STIN1 switches low and toggles the switch 104 to the open position B, in which the input signal ports 106, 108 are disconnected from the input terminals 92, 96 of the differential capacitors 72, 74. In the embodiment shown in FIG. 3, in order to preserve the differential component of the input signal, the control signal S/$\overline{H}$ must switch to low and open the switches 116, 121 before the control signal STIN1 opens switch 104. In another embodiment, to insure that the charge on the common mode capacitors 124, 126 does not change during the hold intervals 302, 302', the control signal STIN1 must switch to low immediately after the control signal S/$\overline{H}$ switches low.

During the hold mode 302, the voltage at node 152 remains at $V_{INN1}$ and the voltage at node 154 remains at $V_{INP1}$. The differential component ($V_{DIFF1}$) of the input signal can be calculated by subtracting the voltage at node 154 ($V_{154}$) from the voltage at node 152 ($V_{152}$) according to equation (3) below.

$$V_{DIFF1}=V_{152}-V_{154}=V_{INN1}-V_{INP1} \tag{3}$$

In equation (3) $V_{INN1}$ and $V_{INP1}$ represent the two analog input voltages at input signal ports 106, 108 at the time the input signals $V_{INN}$, $V_{INP}$ were sampled.

The common mode component ($V_{CM1}$) of the input signal at nodes 152, 154 can be calculated by taking the average of the voltages at nodes 152 ($V_{152}$) and 154 ($V_{154}$) at the time the input signals $V_{INN}$, $V_{INP}$ were sampled according to equation (4) below.

$$V_{CM1} = \frac{V_{152} + V_{154}}{2} = \frac{V_{INN1} + V_{INP1}}{2} \quad (4)$$

The third mode is the conversion mode. The conversion mode is represented by Conversion Interval A 304 and Conversion Interval B 304' in FIG. 3. As described above, the analog to digital converter 80 includes the full differential sample and hold circuit 70, a DAC 82 and a SAR 84. In one embodiment, the DAC 82 has one input terminal 138 and two output terminals 140, 142. The first output terminal 140 of the DAC 82 is electrically coupled to the positive input terminal 86 of the comparator 78 and the second output terminal 142 of the DAC 82 is electrically coupled to the negative input terminal 88 of the comparator 78. In another embodiment, the DAC 82 has N input terminals, where N represents the number of bits of the analog to digital converter 80. The DAC 82 further comprises two capacitors $C_{DAC1}$ 144 and $C_{DAC2}$ 146. In the diagram, the capacitors $C_{DAC1}$ 144 and $C_{DAC2}$ 146 are shown external to the DAC 82 for clarity, but these capacitors are internal to the DAC 82. In one embodiment, the capacitance of $C_{DAC1}$ 144 is approximately equal to the capacitance of $C_{DAC2}$ 146. The SAR 84 has an input terminal 148 electrically coupled to the output terminal 90 of the comparator 78 and an output terminal 150 electrically coupled to the input terminal 138 of the DAC 82. In another embodiment, the SAR 84 has N output terminals to match the number of DAC input terminals, where N represents the number of bits of the analog to digital converter 80.

To enter the first conversion mode represented by Conversion Interval A 304, at time $t_2$ the control signal STIN2 switches high and toggles the switch 112 to the closed position B, in which the input terminal 92 of the first differential capacitor $C_{SP}$ 72 is electrically coupled to the input terminal 96 of the second differential capacitor $C_{SN}$ 74 through switch 112. When the input terminals 92, 96 of the differential capacitors 72, 74 are shorted together, the charge on all the capacitors redistributes among the capacitors. In the preferred embodiment, the capacitance of the first differential capacitor $C_{SP}$ 72 is approximately equal to the capacitance of the second differential capacitor $C_{SN}$ 74, the capacitance of the first common mode capacitor $C_{CMP}$ 124 is approximately equal to the capacitance of the second common mode capacitor $C_{CMN}$ 126 and the capacitance of $C_{DAC1}$ 144 is approximately equal to the capacitance of $C_{DAC2}$ 146. In this embodiment, the common mode voltage ($V_{CM1}$) at nodes 152 and 154 may be calculated according to equation (4) as described above. It can be shown that during the conversion mode, the charge on the capacitors redistributes such that the voltage at nodes 152 and 154 becomes the common mode voltage $V_{CM1}$ of the two input analog signals $V_{INP}$ and $V_{INN}$ calculated above in equation (4).

During the conversion mode, the voltage at node 152 and at the input terminal 92 of the first differential capacitor $C_{SP}$ 72 changes from $V_{INN1}$ to $V_{CM1}$[i.e. $(V_{INP1}+V_{INN1})/2$]. The new potential ($V_{156'}$) of the node 156 may be calculated according to equation (5) below.

$$V_{156'} = V_{156} + \frac{(V_{CM1} - V_{INN1})C_{SP}}{C_{SP} + C_{DAC1}} = V_{156} + \frac{\left(\frac{V_{INP1} - V_{INN1}}{2}\right)C_{SP}}{C_{SP} + C_{DAC1}} \quad (5)$$

Similarly, the voltage at node 154 and at the input terminal 96 of the second differential capacitor $C_{SN}$ 74 changes from $V_{INP1}$ to $V_{CM1}$[i.e. $(V_{INP1}+V_{INN1})/2$]. The new potential ($V_{158'}$) of the node 158 may be similarly calculated according to equation (6) below.

$$V_{158'} = V_{158} + \frac{(V_{CM1} - V_{INP1})C_{SN}}{C_{SN} + C_{DAC2}} = V_{158} + \frac{\left(\frac{V_{INN1} - V_{INP1}}{2}\right)C_{SN}}{C_{SN} + C_{DAC2}} \quad (6)$$

Taking the difference of the voltages at the nodes 156, 158 to find the differential voltage ($V_D$) imposed on the comparator's inputs 86, 88 yields equation (7) below.

$$V_D = V_{156'} - V_{158'} = (V_{156} - V_{158}) + \quad (7)$$

$$\frac{(V_{INP1} - V_{INN1})C_S}{C_S + C_{DAC}} = V_{OS} + \frac{(V_{INP1} - V_{INN1})C_S}{C_S + C_{DAC}}$$

where $C_{SP} = C_{SN} = C_S$ $C_{DAC1} = C_{DAC2} = C_{DAC}$ $C_{CMP} = C_{CMN} = C_{CM}$ Equation (7) represents the differential component of the input signals $V_{INP1}$, $V_{INN1}$, with the common mode component canceled out. The differential voltage ($V_D$) appears at the comparator 78 input across nodes 156 and 158. Because the common mode voltage at the comparator 78 cancels out, the operational amplifier utilized as the comparator 78 need not be designed to operate throughout the entire common mode range of the input signals $V_{INP}$ and $V_{INN}$. This enables the comparator 78 to operate at a constant input stage common mode voltage $V_{CCM}$ regardless of the input signal common mode or differential components, which greatly simplifies the design of the comparator 78.

During the Conversion Interval A 304, at time $t_3$ the voltages at nodes 156 and 158 return to their initial voltages $$V_{156} \left[ \text{i.e. } V_{CCM} + \frac{V_{OS}}{2} \right] \text{ and } V_{158} \left[ \text{i.e. } V_{CCM} - \frac{V_{OS}}{2} \right]$$

respectively. The nodes 156 and 158 return to $V_{156}$ and $V_{158}$ due to the loop formed by the DAC 82, the comparator 78 and the SAR 84.

In order to sample the differential voltage resulting from analog input signals $V_{INP}$ and $V_{INN}$ again, the sample and hold circuit 70 must reset during reset interval 306. To reset the sample and hold circuit 70, at time $t_4$ the control signal S/H returns high and closes switches 116 and 121. Next, at time $t_5$ the control signal STIN2 returns low and opens switch 112. Finally, to initiate the second sampling interval 300', at time $t_6$ the control signal STIN1 returns high and closes switch 104. In the preferred embodiment, the switch 112 is opened before the switch 104 is closed in order to prevent the input signal $V_{INN}$ from being directly coupled to the input signal $V_{INP}$ through the switch 112. In another embodiment, the control signals STIN1, STIN2 and S/H simultaneously toggle switches 104, 112, 116 and 121 to the first sampling position A described above. However, this embodiment may be problematic if the switch 104 is closed before the switch 112 is opened, thereby connecting the two input signals $V_{INN}$, $V_{INP}$. The sample and hold circuit 70 then repeats the sample 300', hold 302', conversion 304' and reset 306' operations described above. At the end of the second sampling interval 300', time $t_7$, $V_{INN2}$ appears at node 152 and $V_{INP2}$ appears at node 154. $V_{INN2}$ and $V_{INP2}$ represent the voltages of the input signals $V_{INN}$, $V_{INP}$ at nodes 106 and 108 respectively, during the second sampling interval 300'.

Figure 4:
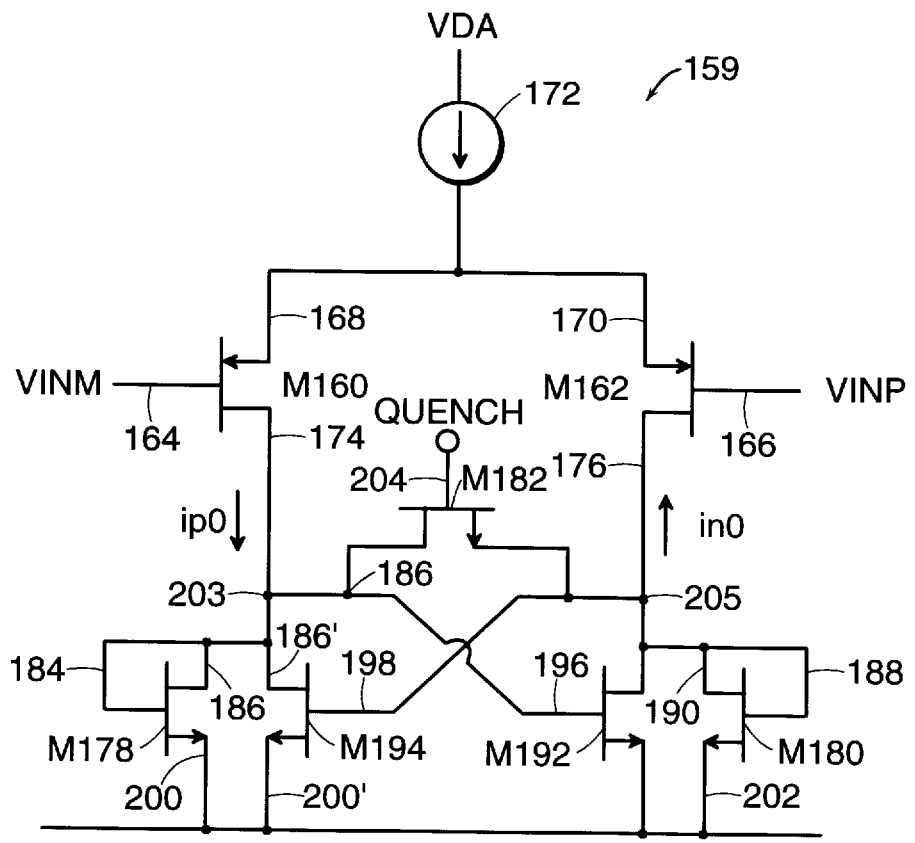
FIG. 4 is a block diagram of an embodiment of the comparator of FIG. 2.

FIG. 4 shows a block diagram of an embodiment of a portion 159 of the comparator 78 shown in FIG. 2. The comparator 78 includes a pair of differential input field effect transistors (FETs) M160, M162, the gate terminals 164, 166 of which are the input terminals 86, 88 of the comparator 78 respectively. VINM represents the input signal at the negative input terminal 88 of the comparator 78 and VINP represents the input signal at the positive input terminal 86 of the comparator 78. The respective source terminals, 168, 170 of FETs M160, M162 are electrically coupled to a virtual current source 172. The respective drain terminals 174, 176 of FETs M160, M162 are connected to diode-clamping FETs M178, M180, respectively, and are cross-coupled via a FET M182. FET M182 has a gate terminal 204 electrically coupled to a QUENCH control signal. The QUENCH control signal is generated in response to a RESETN and a COMPARE control signal (FIGS. 5 and 6), as well as a control signal AZN (FIGS. 5 and 6), which is an inverted version of the AZ control signal. The QUENCH, RESETN, COMPARE and AZ signals are separate control signals for the comparator 78. The generation of the QUENCH control signal will be discussed in more detail below. The clamping FETs M178, M180 have interconnected gate and drain terminals. That is, the gate terminal 184 of FET M178 is electrically coupled to the drain terminal 186 of FET M178 and the gate terminal 188 of FET M180 is electrically coupled to the drain terminal 190 of FET M180. The gate terminal 184 of FET M178 is further electrically coupled to the gate terminal 196 of FET M192 and the gate terminal 188 of FET M180 is electrically coupled to the gate terminal 198 of FET M194. The source terminals 200, 202 of FETs M178, M180 are electrically coupled to ground. The operation of the comparator 78 is discussed in more detail below.

The comparator 78 is not stable and will latch up depending on the initial conditions. For example, if at the start of operation, the drain terminal 174 of FET M164 has a higher potential than the drain terminal 176 of FET M162, a current a $i_p\emptyset$ flows from the drain terminal 174 to the node 203 and a current $i_n\emptyset$ flows from the node 205 to the drain terminal 176. The difference in potential is the seed voltage. The difference in potential causes FET M192 to be more conductive which causes the drain terminal 176 of FET M162 to decrease in potential even further. The difference in potential also causes FET M194 to be less conductive which causes the drain terminal 174 of FET M160 to increase in potential. This positive feedback process repeats itself until the comparator 78 saturates and the FET M194 becomes an open switch. This positive feedback process is known in the art as regeneration. At the end of the regeneration process, the majority of the current flows through the FETs M162, M180 and M192 and a very small non-zero amount of current flows through the FETs M160, M178 and M194. The small amount of current flowing through FETs M160, M178, M194 is not identically zero amperes, but is very small. The comparator 78 will regenerate any amount of seed voltage until the comparator 78 saturates and the specified saturation voltage of the comparator 78 appears across nodes 203 and 205. Whether the drain terminal 174 of FET M160 is at a higher or lower potential than the drain terminal 176 of FET M162 upon the start of the regeneration process determines in which direction the comparator 78 will saturate (i.e. whether node 203 or node 205 saturates to a higher saturation potential).

The purpose of the clamp FETs M178, M180 is to reduce the saturation voltage of the comparator for reset. The clamp FETs M178, M180 speed up the comparator reset process for the next cycle. The clamp FETs M178, M180 conduct less current than the cross-coupled FETs M192, M194. Clamp FETs M178, M180 enable the comparator 78 to be reset more easily.

The comparator 78 has three modes of operation: a reset mode, a compare mode and an offset cancellation mode. The reset mode stops the regeneration process described above. To initiate the reset mode, the QUENCH signal is connected to the positive supply voltage VDA. During the reset mode, FET M182 conducts and behaves as a closed switch, essentially shorting together nodes 203 and 205. Shorting together nodes 203 and 205 causes current $i_{p\emptyset}$ to flow from the drain terminal 176 of FET M162 to the node 205 and the current $i_{n\emptyset}$ to flow from the node 203 to the drain terminal 174 of FET M178. Operating FET M182 as a closed switch also impresses the seed voltage on the crosscoupled FETs M194, M192.

To initiate the compare mode, the QUENCH signal is connected to ground. During the compare mode, FET M182 behaves as an open switch and disconnects node 203 from node 205. Regeneration occurs until the clamp FETs M178 and M180 clamp. During the offset cancellation mode, the QUENCH signal is at a mid-level point between VDA and ground. During the offset cancellation mode, the FET M182 does not behave as a closed switch or an open switch. Transitioning between the three modes of operation will be discussed in more detail below.

Figure 5:
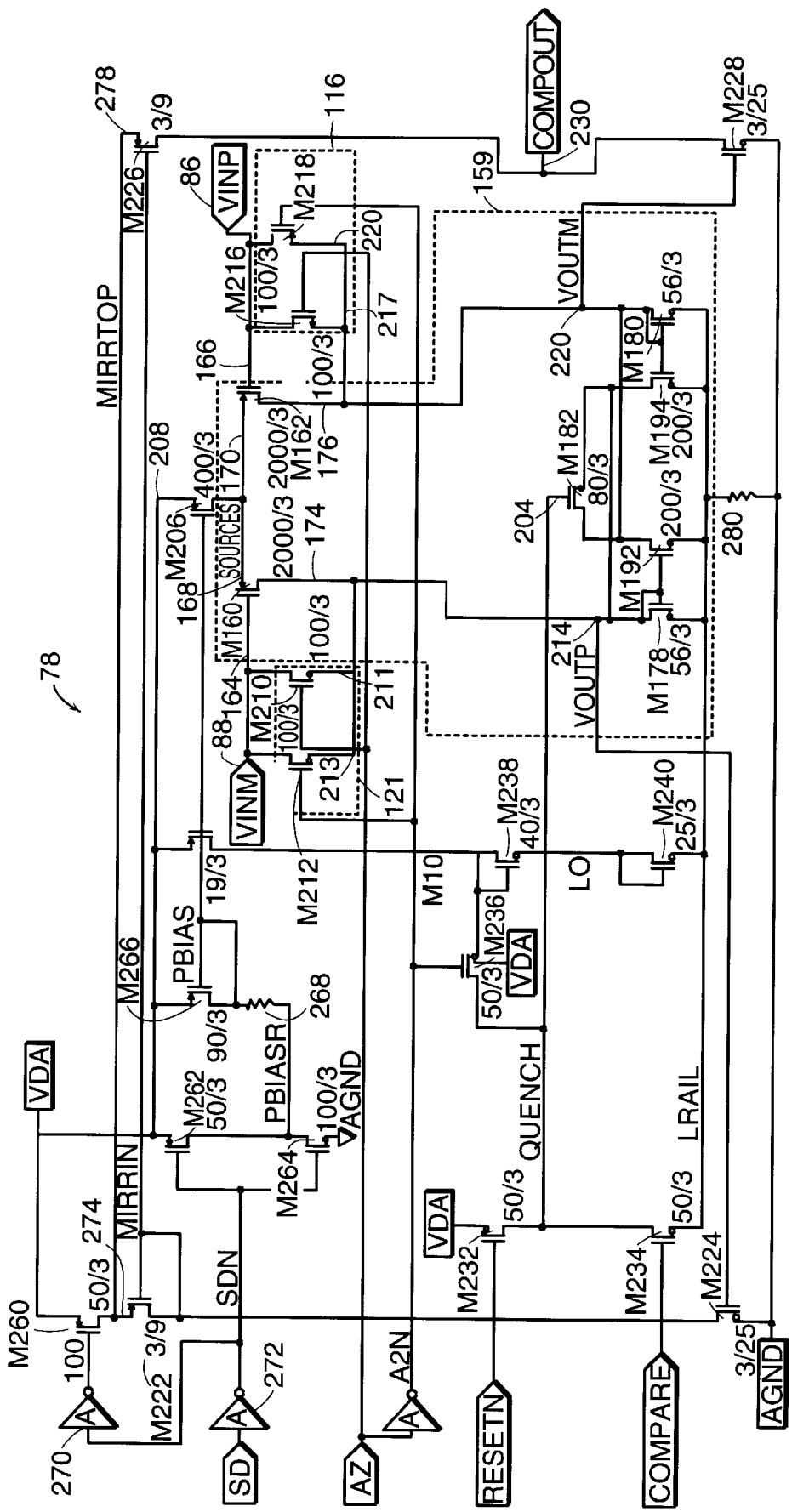
FIG. 5 is a schematic diagram of an embodiment of the comparator of FIG. 2.

FIG. 5 is a schematic diagram of an embodiment of the comparator 78 of FIGS. 2 and 4. The schematic diagram includes the portion 159 of the comparator 78 shown in FIG. 4. The current source 172 shown in FIG. 4 includes a current sourcing FET M206 which has a source terminal 208 electrically coupled to the positive voltage supply VDA. The gate terminal 164 of FET M160 is electrically coupled to the drain terminals of FETs M210 and M212, which have source terminals 211, 213 respectively, which are electrically coupled to output node VOUTP 214. The gate terminal of FET M210 is controlled by the control signal AZ and the gate terminal of FET M212 is controlled by the control signal AZN, an inverted version of the control signal AZ. The gate terminal 166 of FET M162 is electrically coupled to the drain terminals of FETs M216 and M218, which have source terminals 217, 220 respectively, which are electrically coupled to output node VOUTM 220.

A gain stage of the comparator 78 includes FETs M222, M224, M226 and M228 which amplify the differential voltage between circuit nodes VOUTP 214 and VOUTM 220 to provide the single-ended comparator output signal COMPOUT at node 230 at logic levels corresponding to the positive supply voltage VDA or ground.

Figure 6:
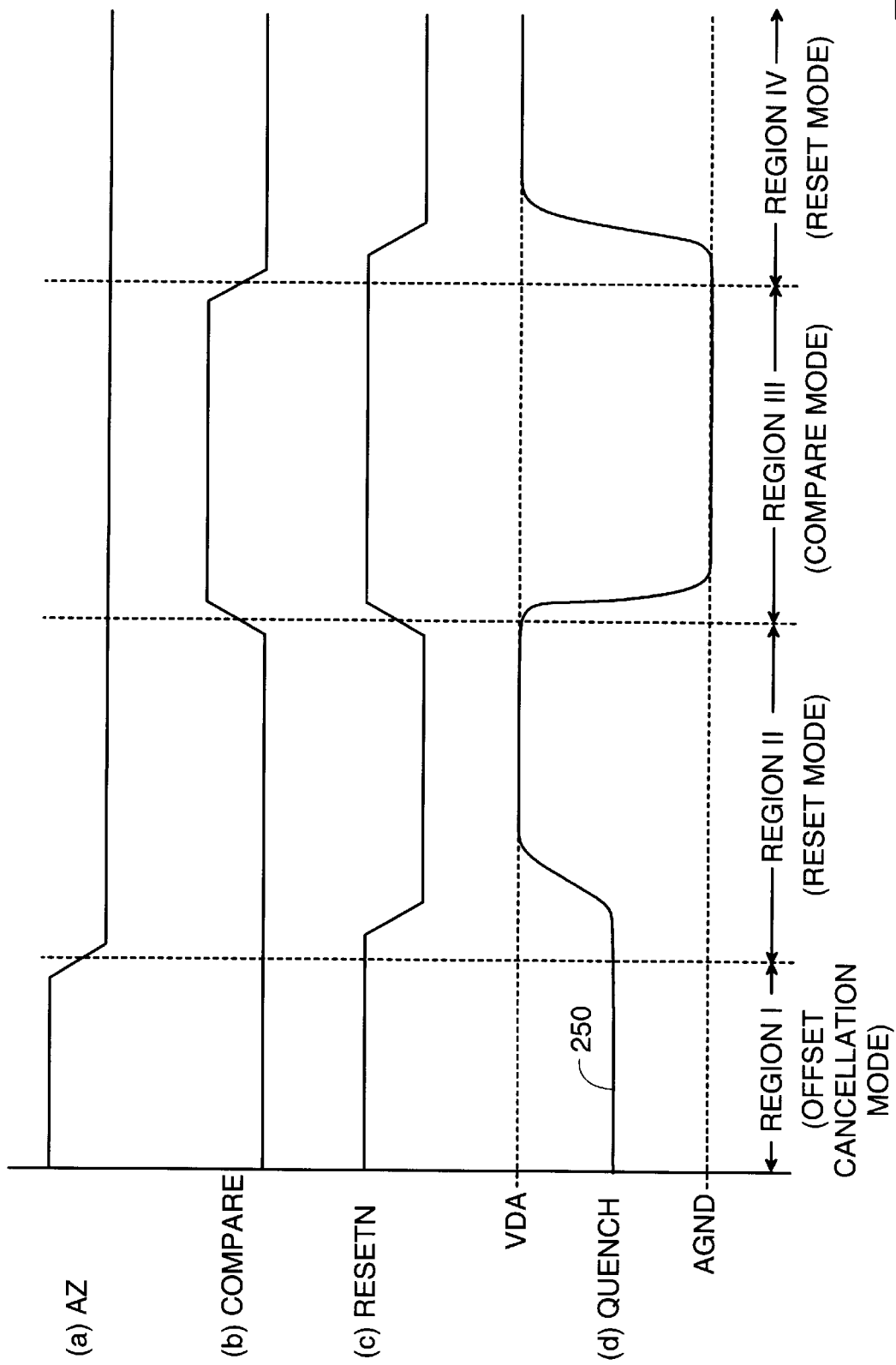
FIG. 6 is a timing diagram of control signals associated with the comparator of FIG. 2.

A mode selection portion of the comparator 78 includes FETs M182, M232, M234, M236, M238 and M240. The mode selection portion determines in which of the three modes the comparator 78 operates. FET M182 has a gate terminal 204 electrically coupled to the QUENCH control signal which is generated by FETs M232, M234, M236, M238 and M240 in response to the RESETN and COMPARE control signals, as well as control signal AZN, which is an inverted version of the AZ control signal. FIG. 6 is a timing diagram of the control signals AZ, COMPARE, RESETN and QUENCH during the three modes of operation. Waveform (a) depicts the AZ control signal, waveform (b) depicts the COMPARE control signal and waveform (c) depicts the RESETN control signal. Finally, waveform (d) represents the QUENCH control signal which is a function of the AZ, COMPARE and RESETN control signals.

During the offset cancellation mode, Region I, the control signals RESETN, COMPARE and AZ control FETs M232, M234, M236, M238 and M240 to place a "mid-level"

voltage 250 on the QUENCH signal and on the gate terminal 204 of FET M182. The mid-level voltage 250 is a voltage that is approximately midway between the positive supply voltage VDA and ground AGND. During the offset cancellation mode, the control signals AZ and RESETN are high and the control signal COMPARE is low. The high RESETN control signal causes FET M232 to behave as an open switch. Similarly, the control signal COMPARE causes the FET M234 to behave as an open switch. The control signal AZ causes FETs M236, M238 and M240 to conduct, thereby placing the mid-level voltage 250 on the gate terminal 204 of FET M182. The control signal AZ also causes FETs M210, M212, M216 and M218 to behave as closed switches and short the inputs VINM, VINP to the respective output VOUTP, VOUTM.

The mid-level voltage of the QUENCH signal provides a partial electrical connection between the VOUTP 214 and VOUTM 220 circuit nodes, such that positive feedback between the nodes is eliminated but the nodes VOUTP 214 and VOUTM 220 are not shorted together. With this arrangement, the comparator offset voltage $V_{OS}$ is impressed on the differential voltage ($V_{INP}$-$V_{INM}$) at the comparator inputs 86, 88. The DC offset voltage at the comparator inputs 86, 88 is stored differentially on the DAC 82 with a weight of one. That is, the drain terminals of FETs M160, M162 which are coupled to the gate terminals 164, 166 thereof via conducting FETs M210, M212, M216, 218 see a high impedance associated with cross-coupled FETs M192, M194 and clamping FETs M178, M180, respectively.

During the reset mode, Region II, the RESETN control signal transitions low which causes FET M232 to conduct and connects the QUENCH signal to the positive supply voltage VDA. Connecting the QUENCH signal to the positive supply voltage places VDA on the gate terminal 204 of FET M182. As discussed above, FET M182 then behaves as a closed switch, shorting VOUTP 214 and VOUTM 220 together through FET M182. Shorting VOUTP 214 and VOUTM 220 together seeds the unbalance between the voltages on nodes 220 and 214 for regeneration in the compare mode. Also, during the reset mode, the AZ control signal switches low which causes FETs M236, M238 and M240 to behave as open switches and stop conducting. The AZ control signal also causes FETs M210, M212, M216 and M218 to behave as open switches.

During the compare mode, Region III, the COMPARE control signal switches high and causes FET M234 to conduct and electrically couple the QUENCH signal to ground AGND. Coupling the QUENCH signal to ground AGND causes FET M182 not to conduct and behave as an open switch, thereby releasing VOUTP and VOUTN to regenerate the seed voltage. Also during the compare mode, the control signal RESETN switches high and causes FET M232 to stop conducting and behave as an open switch. The comparator 78 then initiates the reset mode again in Region IV.

The comparator 78 also has a shut-down portion which is controlled by a control signal SD. The shut-down portion includes FETs M260, M262, M264, M266, a resistor RBIAS 268 and inverters 270, 272. The control signal SD has two states, high and low. Under certain circumstances a user may wish to shut down the comparator 78. For example, shutting down the comparator 78 may be desirable to conserve the power supply when the comparator 78 is not in use. In normal comparator operation, the control signal SD is low, which causes FET M260 to conduct and places the source voltage VDA on the source terminals 274, 278 of FETs M222, M226, respectively. Also, in normal operation, the resistor RBIAS 268 is shorted to ground AGND through FET M264. To shut down the comparator 78, the user externally switches the control signal SD high, thereby disconnecting the source terminals 274, 278 of FETs M222, respectively, from the positive supply voltage VDA. To resume comparator 78 operation, the user externally returns the control signal SD low. One additional feature of comparator 78 is the level shift resistor RLRAIL 280. The purpose of the level shift resistor RLRAIL 280 is to shift the operating range of the comparator 78 toward the middle of the supply voltages VDA and AGND.

Figures 7, 7A:
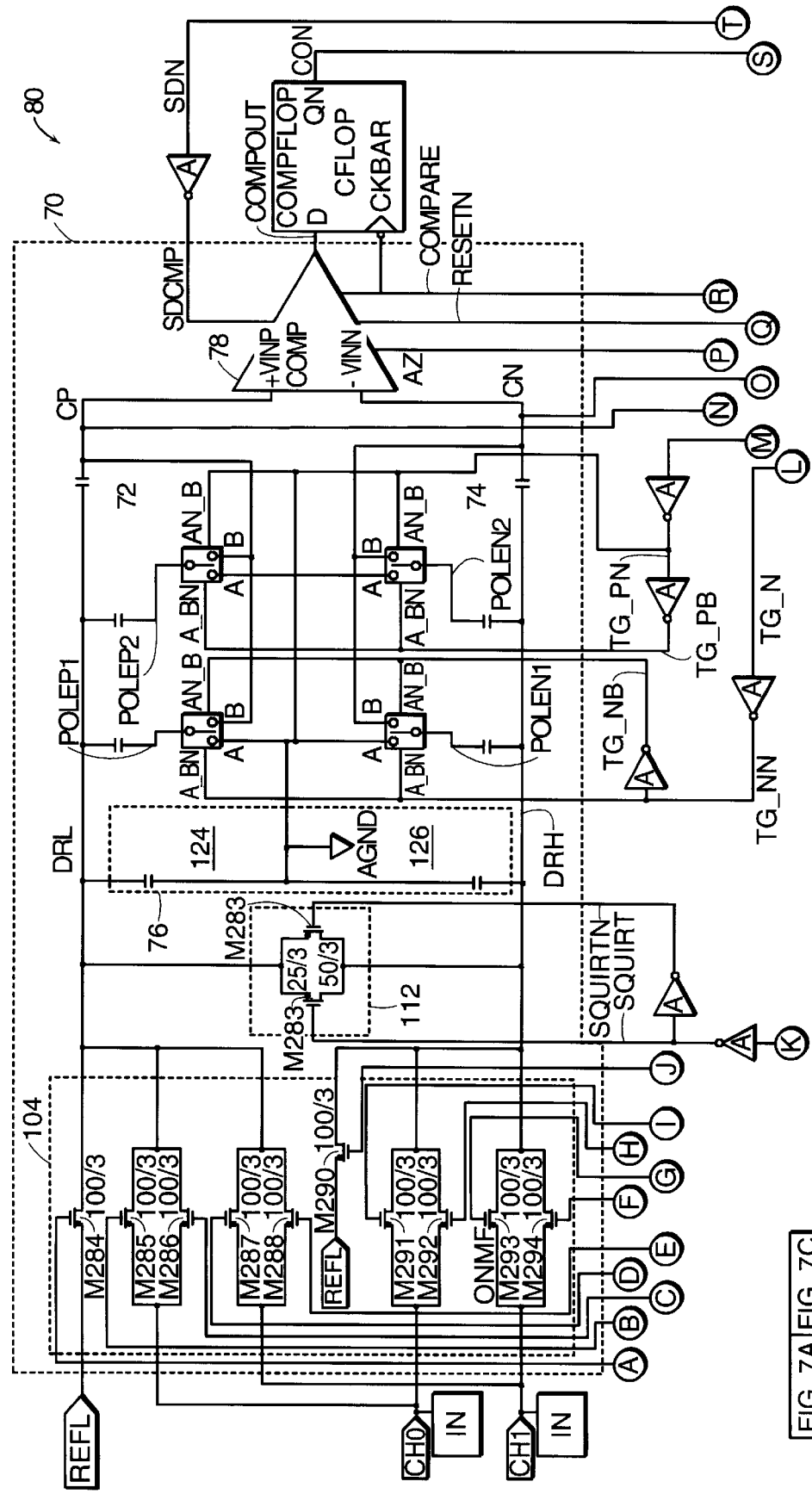
FIGS. 7A, 7B and 7C are sections of a schematic diagram of an embodiment of an analog to digital converter including an embodiment of a sample and hold circuit in accordance with the present invention.
Figure 7B:
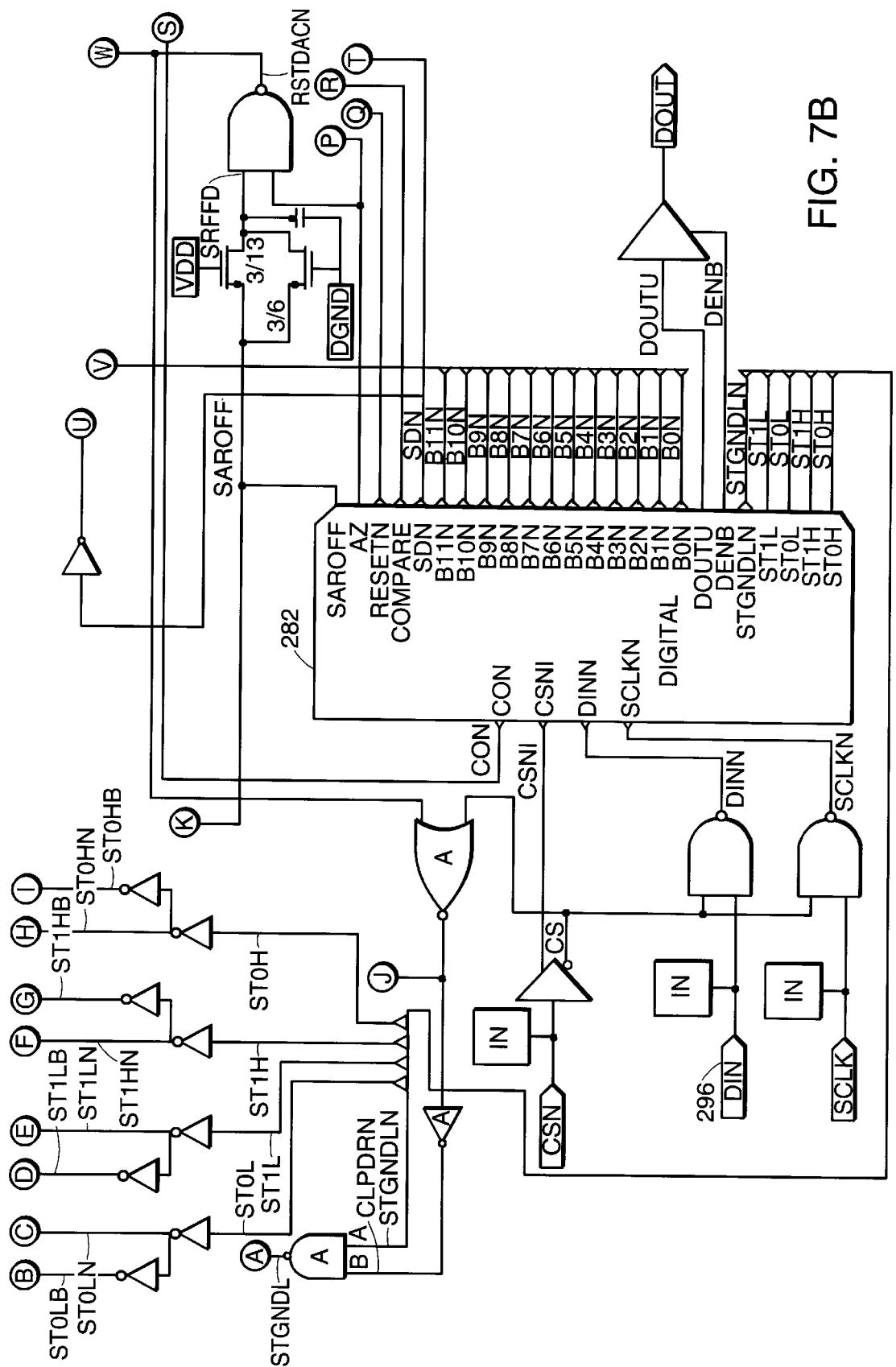
Figure 7C:
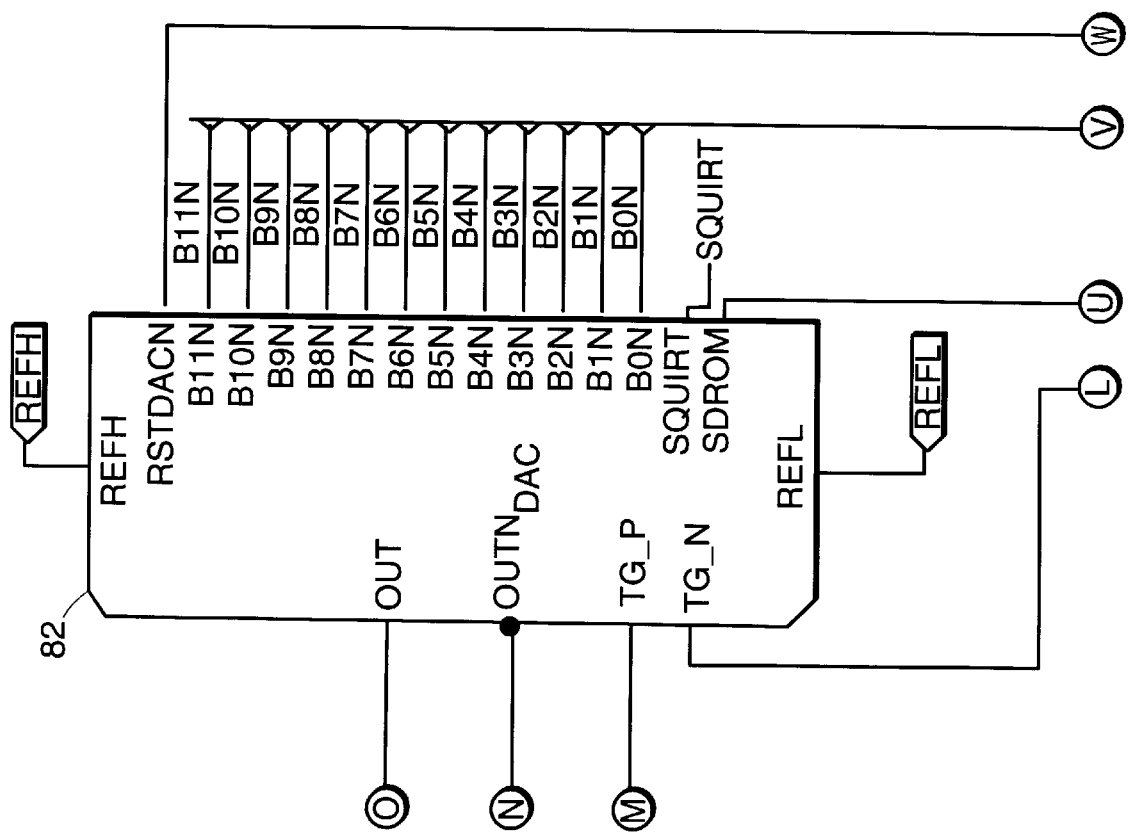

FIGS. 7A, 7B and 7C are sections of a schematic diagram of an embodiment of the analog to digital converter 80 shown in FIG. 2. As described above, the analog to digital converter 80 includes the full differential sample and hold circuit 70, the DAC 82 and the SAR 84 which is located within the component 282. The sample and hold circuit 70 includes two differential capacitors $C_{SP}$ 72, $C_{SN}$ 74, the comparator 78, the common mode sample and hold circuit 76 and the switches 104, 112. The switches 116, 121 and the voltage source ($V_{OS}$) 120 shown in FIG. 2 are internal to the comparator 78. Similarly, the DAC capacitors $C_{DAC1}$ 144 and $C_{DAC2}$ 146 shown in FIG. 2 are internal to the DAC 82. In the embodiment shown in FIG. 7, the common mode sample and hold circuit 76 includes two common mode capacitors $C_{CMP}$ 124, $C_{CMN}$ 126. In one embodiment, the capacitance of each of the common mode capacitors $C_{CMP}$ 124, $C_{CMN}$ 126 is approximately equal to 5 pF. In another embodiment, the capacitance of the differential capacitors 72, 74 is approximately equal to twice the capacitance of the DAC capacitors 144, 146. In the preferred embodiment, the capacitance of the differential capacitors 72, 74 is approximately equal to 12.8 pF and the capacitance of the DAC capacitors 144, 146 is approximately equal to 6.4 pF. Also, in the preferred embodiment, in on chip fabrication, the plates of the differential capacitors 72, 74 are interdigitated within the DAC 82.

In the embodiment shown in FIGS. 7A, 7B and 7C the switch 112 includes two FETs M283, M283' and the switch 104 includes a number of FETs M284, M285, M286, M287, M288, M290, M291, M292, M293, M294. In one embodiment, the full differential sample and hold circuit 70 has four different operating configurations. The four different operating configurations depend on which of the three possible input signals REFL, CHØ, and CH1 are used as the input signals $V_{INN}$, $V_{INP}$. The user controls which signals are used as the input signals $V_{INN}$, $V_{INP}$ through program pin DIN 296. CHØ and CH1 may be used as either $V_{INN}$ or $V_{INP}$, but REFL can only be used as $V_{INN}$. In one embodiment, REFL is ground. The four possible combinations that the user may select are: CHØ minus REFL, CH1 minus REFL, CHØ minus CH1, and CH1 minus CHØ.

Having described preferred embodiments of the invention, it will now become apparent to one of skill in the art that other embodiments incorporating the concepts may be used. It is felt, therefore, that these embodiments should not be limited to disclosed embodiments but rather should be limited only by the spirit and scope of the following claims.

What is claimed is:

1. A sample and hold circuit comprising:

a comparator having a first input terminal a second input terminal and an output terminal, wherein said first input terminal and said second input terminal are adapted for selective coupling to a differential reference voltage;

a first differential capacitor having an input terminal adapted for selective coupling to a first input signal and an output terminal electrically coupled to said first terminal of said comparator;

a second differential capacitor having an input terminal adapted for selective coupling to a second input signal and an output terminal electrically coupled to said second terminal of said comparator; and a common mode sample and hold circuit having a first terminal electrically coupled to said input terminal of said first differential capacitor and a second terminal electrically coupled to said input terminal of said second differential capacitor.

2. A sample and hold circuit comprising:

a comparator comprising;
- a first input terminal;
- a second input terminal;
- a differential reference voltage source having a first terminal and a second terminal;
- a first differential reference voltage source switch disposed between said first input terminal of said comparator and said first terminal of said differential reference voltage source, said first differential reference voltage source switch adapted for being in a first position in which said first terminal of said differential reference voltage source is electrically coupled to said first input terminal of said comparator and a second position in which said first input terminal of said comparator is not electrically coupled to said first terminal of said differential reference voltage source; and
- a second differential reference voltage source switch disposed between said second input terminal of said comparator and said second terminal of said differential reference voltage source, said second differential reference voltage source switch adapted for being in a first position in which said second terminal of said differential reference voltage source is electrically coupled to said second input terminal of said comparator and a second position in which said second input terminal of said comparator is not electrically coupled to said second terminal of said first differential reference voltage source;

a first differential capacitor having an input terminal adapted for selective coupling to a first input signal and an output terminal electrically coupled to said first terminal of said comparator;

a second differential capacitor having an input terminal adapted for selective coupling to a second input signal and an output terminal electrically coupled to said second terminal of said comparator; and a common mode sample and hold circuit having a first terminal electrically coupled to said input terminal of said first differential capacitor and a second terminal electrically coupled to said input terminal of said second differential capacitor.

3. A sample and hold circuit comprising:

a comparator having a first input terminal, a second input terminal and an output terminal;

a first differential capacitor having an input terminal adapted for selective coupling to a first input signal and an output terminal electrically coupled to said first terminal of said comparator;

a second differential capacitor having an input terminal adapted for selective coupling to a second input signal and an output terminal electrically coupled to said second terminal of said comparator; and a common mode sample and hold circuit comprising:
- a first common mode capacitor having an output terminal electrically coupled to a capacitor reference voltage source and an input terminal electrically coupled to said input terminal of said first differential capacitor; and
- a second common mode capacitor having an output terminal electrically coupled to the capacitor reference voltage source and an input terminal electrically coupled to said input terminal of said second differential capacitor.

4. The sample and hold circuit of claim 3 wherein the capacitor reference voltage source is ground.

5. An analog to digital converter comprising:

a sample and hold circuit comprising:
- a comparator having a first input terminal, a second input terminal and an output terminal;
- a first differential capacitor having an input terminal adapted for selective coupling to a first input signal and an output terminal electrically coupled to said first terminal of said comparator;
- a second differential capacitor having an input terminal adapted for selective coupling to a second input signal and an output terminal electrically coupled to said second terminal of said comparator;
- a common mode sample and hold comprising:
  - a first common mode capacitor having an output terminal electrically coupled to a capacitor reference voltage source and an input terminal electrically coupled to said input terminal of said first differential capacitor; and
  - a second common mode capacitor having an output terminal electrically coupled to the capacitor reference voltage source and an input terminal electrically coupled to said input terminal of said second differential capacitor; and a DAC having an input terminal, a first output terminal and a second output terminal, said DAC input terminal being electrically coupled to said output terminal of said comparator, said first DAC output terminal being electrically coupled to said first input terminal of said comparator and said second DAC output terminal being electrically coupled to said second input terminal of said comparator.

6. The analog to digital converter of claim 5 further comprising a successive approximation register having a first terminal electrically coupled to said output terminal of said comparator and a second terminal electrically coupled to said input terminal of said DAC.

7. A method of sampling and holding a differential signal, comprising the steps of:

(a) sampling the differential signal, wherein said sampling step further comprises the steps of:

electrically coupling a first input signal to a first input terminal of a comparator through a first differential capacitor, said first differential capacitor having an input terminal electrically coupled to a first terminal of a common mode sample and hold circuit and an output terminal electrically coupled to said first input terminal of said comparator;

electrically coupling a second input signal to a second input terminal of said comparator through a second differential capacitor, said second differential capacitor having an input terminal electrically coupled to a second terminal of said common mode sample and hold circuit and an output terminal electrically coupled to said second input terminal of said comparator;

applying a first reference voltage across said first input terminal of said comparator and said second input terminal of said comparator;

(b) removing the first reference voltage;

(c) simultaneously removing the first input signal and the second input signal; and (d) electrically coupling said first terminal of said common mode sample and hold circuit to said second terminal of said common mode sample and hold circuit.

8. A method of converting a differential analog signal into a corresponding digital signal, comprising the steps of:

(a) sampling the differential signal, wherein said sampling step further comprises the steps of:

electrically coupling a first input signal to a first input terminal of a comparator through a first differential capacitor, said first differential capacitor having an input terminal electrically coupled to a first terminal of a common mode sample and hold circuit and an output terminal electrically coupled to said first input terminal of said comparator;

electrically coupling a second input signal to a second input terminal of said comparator through a second differential capacitor, said second differential capacitor having an input terminal electrically coupled to a second terminal of said common mode sample and hold circuit and an output terminal electrically coupled to said second input terminal of said comparator;

applying a first reference voltage across said first input terminal of said comparator and said second input terminal of said comparator;

(b) removing the first reference voltage;

(c) simultaneously removing the first input signal and the second input signal;

(d) electrically coupling said first terminal of said common mode sample and hold circuit to said second terminal of said common mode sample and hold circuit;

(e) electrically coupling a first output terminal of a DAC to said first comparator input terminal and a second output terminal of said DAC to said second comparator input terminal; and (f) electrically coupling an output terminal of said comparator to an input terminal of said DAC.

\* \* \* \* \*